(12) United States Patent
Sakdinawat et al.

(10) Patent No.: US 12,532,712 B2
(45) Date of Patent: Jan. 20, 2026

(54) MASK FOR X-RAY LITHOGRAPHY AND METROLOGY

(71) Applicant: Exaktis Corporation, Coppell, TX (US)

(72) Inventors: Anne Sakdinawat, Coppell, TX (US); Yanwei Liu, Danville, CA (US)

(73) Assignee: Exaktis Corporation, Coppell, TX (US)

( * ) Notice: Subject to any disclaimer, the term of this patent is extended or adjusted under 35 U.S.C. 154(b) by 188 days.

(21) Appl. No.: 18/480,487

(22) Filed: Oct. 3, 2023

(65) Prior Publication Data

US 2024/0112913 A1 Apr. 4, 2024

Related U.S. Application Data

(60) Provisional application No. 63/378,247, filed on Oct. 4, 2022.

(51) Int. Cl.
| | | |
|---|---|---|
| *H01L 21/02* | (2006.01) | |
| *G03F 1/22* | (2012.01) | |
| *H01L 21/027* | (2006.01) | |
| *H01L 21/033* | (2006.01) | |
| *H01L 21/768* | (2006.01) | |

(52) U.S. Cl.
CPC ........... *H01L 21/0278* (2013.01); *G03F 1/22* (2013.01); *H01L 21/0337* (2013.01); *H01L 21/76877* (2013.01)

(58) Field of Classification Search
CPC ... G03F 1/22; H01L 21/0278; H01L 21/0337; H01L 21/76877
See application file for complete search history.

(56) References Cited

U.S. PATENT DOCUMENTS

| | | |
|---|---|---|
| 3,742,229 A | 6/1973 | Smith et al. |
| 4,035,522 A | 7/1977 | Hatzakis |
| 4,536,882 A | 8/1985 | Jones et al. |
| 4,890,309 A | 12/1989 | Smith et al. |
| 5,146,481 A | 9/1992 | Garg et al. |
| 5,793,836 A | 8/1998 | Maldonado et al. |
| 6,317,479 B1 | 11/2001 | Chiba |
| 6,482,553 B1 | 11/2002 | Gottert et al. |

(Continued)

FOREIGN PATENT DOCUMENTS

| | | |
|---|---|---|
| EP | 880073 B1 | 8/2008 |
| WO | WO-2011128031 A1 * | 10/2011 ............... G03F 1/22 |

OTHER PUBLICATIONS

English translation of WO 2011128031 A1 (Year: 2011).*

(Continued)

*Primary Examiner* — Mark R Gaworecki
(74) *Attorney, Agent, or Firm* — Fish & Richardson P.C.

(57) ABSTRACT

A mask apparatus for x-ray lithography and metrology where the x-ray absorber material is embedded in diamond and then covered with a thermally conductive material to provide requisite thermal conductivity when irradiated with x-rays. The apparatus then includes a hollow holder that is thermally interfaced with the mask and may also include means for external thermal control. The mask apparatus allows for transmission of x-rays from a lithography beam as well as metrology beams of other wavelengths including UV, IR, visible, and others.

13 Claims, 6 Drawing Sheets

(56) References Cited

U.S. PATENT DOCUMENTS

| | | |
|---|---|---|
| 7,008,737 B2 | 3/2006 | Morales |
| 10,119,201 B2 | 11/2018 | Piracha |
| 10,297,359 B2 | 5/2019 | Yun et al. |

OTHER PUBLICATIONS

Guo et al. "Tunable and transferable diamond membranes for integrated quantum technologies," Nano Letters, 2021, 21(24): 10392-10399.

Maldonado, "X-ray lithography system development at IBM: Overview and status," Electron-Beam, X-Ray, and Ion-Beam Submicrometer Lithographies for Manufacturing, Aug. 1991, 1465:2-15, 3 pages (Abstract only).

Piracha et al. "Scalable fabrication of high-quality, ultra-thin single crystal diamond membrane windows," Nanoscale, 2016, 8(12): 6860-6865.

Ravet et al. "Evaluation of a diamond-based x-ray mask for high resolution xray proximity lithography," Journal of Vacuum Science & Technology B: Microelectronics and Nanometer Structures Processing, Measurement, and Phenomena, 1995, 13(6): 3055-3060.

Stoupin et al., "Thermal expansion of diamond at low temperatures," Physical review letters, 2010, 104(8):085901, 3 pages (Abstract only).

Windischmann et al., "Properties of diamond membranes for xray lithography," Journal of applied physics, 1990, 68:5665-5673, 5 pages (Abstract only).

Xiao et al. "Modeling image formation: Application to mask optimization," Journal of Vacuum Science & Technology B: Microelectronics and Nanometer Structures Processing, Measurement, and Phenomena, 1994 12(6): 4038-4043, 2 pages (Abstract only).

\* cited by examiner

MASK FOR X-RAY LITHOGRAPHY AND METROLOGY

CROSS-REFERENCE TO RELATED APPLICATIONS

This application claims the benefit of U.S. Provisional Patent Application No. 63/378,247, filed Oct. 4, 2022, which is incorporated by reference herein in its entirety.

PRIOR ART

US PATENT DOCUMENTS

| | | | | |
|---|---|---|---|---|
| 1973/3742229 | June 1973 | Smith | | |
| 1977/4035522 | July 1977 | Hatzakis | B05D 3/06 | 427/43 |
| 1985/4536882 | August 1985 | Jones | G21C 11/00 | 378/35 |
| 1989/4890309 | December 1989 | Smith | B05D 3/06 | 378/35 |
| 1992/5146481 | September 1992 | Garg | G21K 5/00 | 378/35 |
| 1998/5793836 | August 1998 | Maldonado | H05K 1/00 | 378/35 |
| 2001/6317479 B1 | November 2001 | Chiba | H01L 27/00 | 378/35 |
| 2002/6482553 B1 | November 2002 | Göttert | | |
| 2006/7008737 B2 | March 2006 | Morales | G03F 7/20 | 430/5 |
| 2018/10119201 B2 | November 2018 | Piracha | C30B 25/20 | |
| 2019/10297359 B2 | May 2019 | Yun et al. | | |

FOREIGN PATENT DOCUMENTS

| | | |
|---|---|---|
| EP 880073 B1 | 8/2008 | Noguchi et al. |

OTHER PUBLICATIONS

Windischmann, Henry, and Glenn F. Epps. "Properties of diamond membranes for x-ray lithography." Journal of applied physics 68.11 (1990): 5665-5673.

Maldonado, Juan R. "X-ray lithography system development at IBM: Overview and status." Electron-Beam, X-Ray, and Ion-Beam Submicrometer Lithographies for Manufacturing 1465 (1991): 2-15.

Xiao, Jiabei, et al. "Modeling image formation: Application to mask optimization." Journal of Vacuum Science & Technology B: Microelectronics and Nanometer Structures Processing, Measurement, and Phenomena 12.6 (1994): 4038-4043.

Ravet, M. F., et al. "Evaluation of a diamond-based x-ray mask for high resolution x-ray proximity lithography." Journal of Vacuum Science & Technology B: Microelectronics and Nanometer Structures Processing, Measurement, and Phenomena 13.6 (1995): 3055-3060.

Stoupin, Stanislav, and Yuri V. Shvyd'ko. "Thermal expansion of diamond at low temperatures." Physical review letters 104.8 (2010): 085901.

Piracha, Afaq Habib, et al. "Scalable fabrication of high-quality, ultra-thin single crystal diamond membrane windows." Nanoscale 8.12 (2016): 6860-6865.

Guo, Xinghan, et al. "Tunable and transferable diamond membranes for integrated quantum technologies." Nano Letters 21.24 (2021): 10392-10399.

FIELD OF THE INVENTION

The present invention relates to a transmission mask for x-ray lithography and metrology. The invention further relates to a mask comprising a patterned membrane, at least one embedded absorbing layer, and a capping layer that encapsulates the absorber pattern.

BACKGROUND OF THE INVENTION

In integrated circuit manufacturing, patterns are transferred using photomasks ("masks") onto a substrate. As the dimensions continue to shrink, shorter wavelengths of light for use in photolithography continue to be considered. EUV lithography which operates using 13.5 nm light is the leading technology used for high volume production of integrated circuits. Wavelengths shorter than 13.5 nm beyond EUV and into the x-ray wavelength regime are being explored for their potential to pattern smaller features with a single exposure.

Practical implementation of X-ray lithography has been limited to proximity or contact printing with no demagnification or interference lithography with the possibility of small demagnification. Dimensions of patterns on masks for x-ray lithography are then similar to the dimensions required for printing. Prior masks for X-ray lithography have utilized an absorbing or phase shifting patterned layer to produce the light intensity modulation required in a transmission geometry. The absorbing or phase shifting layer is patterned on top of a thin, unpatterned membrane that defines the active mask area. The membrane is supported around the active mask area by a thicker substrate and in some instances, additionally a pellicle and an additional support ring. The membrane and substrate are generally composed of different materials.

The requirement for x-ray transparency limits the thickness of mask membranes and competes directly with the simultaneous requirements for resolution, placement accuracy and overlay, and requisite x-ray dose for high throughput patterning. X-ray masks must have sufficiently high contrast, rigidness, flatness, thermal stability, and compatibility with metrology and alignment methods that additionally utilize longer wavelength light. A mask design that satisfies these lithography and metrology requirements is needed.

SUMMARY OF THE INVENTION

It is an object of the present invention to provide an X-ray mask which can meet the requirements for resolution, placement accuracy and overlay, and dose for high throughput patterning.

It is another object of the invention to provide an X-ray mask which is additionally compatible with metrology and alignment methods that utilize longer wavelength light.

Throughout this description, the term "diamond material" is used for films or bulk materials of single-crystalline diamond material and poly-crystalline diamond material. The invention is a mask apparatus for x-ray lithography and metrology where the x-ray absorber material is embedded in diamond material and then covered with a thermally conductive material to provide requisite thermal conductivity when irradiated with x-rays. The apparatus then includes a hollow holder that is thermally interfaced with the mask and may also include means for external thermal control. The mask apparatus allows for transmission of x-rays from a lithography beam as well as metrology beams of other wavelengths including UV, IR, visible, and others.

The x-ray mask which comprises a mask substrate and membrane composed of a single material. The material can be single crystalline diamond with membrane thickness ranging from 0.05 micrometers to 5 micrometers. Alternately, the material can be polycrystalline diamond with membrane thickness ranging from 0.05 micrometers to 5 micrometers. The mask is patterned with features etched into the diamond material membrane. The absorber layer is filled into the etched pattern and planarized. A capping layer is placed on top of the absorber layer and substrate.

In a second embodiment, the mask substrate comprises etched features of a plurality of depths.

In a third embodiment, the absorber layer comprises a plurality of materials.

In a fourth embodiment, the absorber layer comprises a coating on the sidewalls of the etched features in the substrate.

In a fifth embodiment, the mask substrate comprises a plurality of active mask areas separated by a backside support structure etched into the substrate.

In a sixth embodiment, a hollow mounting structure is adhered to the mask with a thermally conductive material and with active cooling or heating apparatus to control the temperature of the mask.

This invention addresses several challenges for x-ray masks. First, the use of diamond material as the mask substrate and membrane provides acceptable transparency to both x-rays and longer wavelength metrology beams with wavelengths in the infrared, visible, and ultraviolet. Second, the absorbing layer that is embedded in the etched diamond material membrane can meet high contrast requirements for patterning. Third, the diamond material substrate and membrane can provide nanometer level surface flatness and high thermal conductivity from the absorbing layer into the diamond material which allows the mask to remain thermally stable under intense x-ray illumination, while minimizing thermal expansion to meet nanometer placement accuracy requirements across the mask active area. Additional cooling and thermal control to lower temperatures enhances the thermal conductivity properties of diamond material. Fourth, the encapsulation of the absorbing layer leads to robustness of handling and a cleanable surface, and reduces defect formation on the mask pattern.

BRIEF DESCRIPTION OF DRAWINGS

Embodiments of the present disclosure are described in the detailed description and the accompanying figures. Various features in the drawings are not drawn to scale, and the dimensions may be increased or decreased for clarity. Appended drawings illustrate methods of fabrication and several possible embodiments of the invention. It will be understood these embodiments examples are not to be considered as limiting its scope regarding other embodiments which the invention is capable of contemplating. Accordingly.

DETAILED DESCRIPTION OF THE INVENTION

Figure 1:
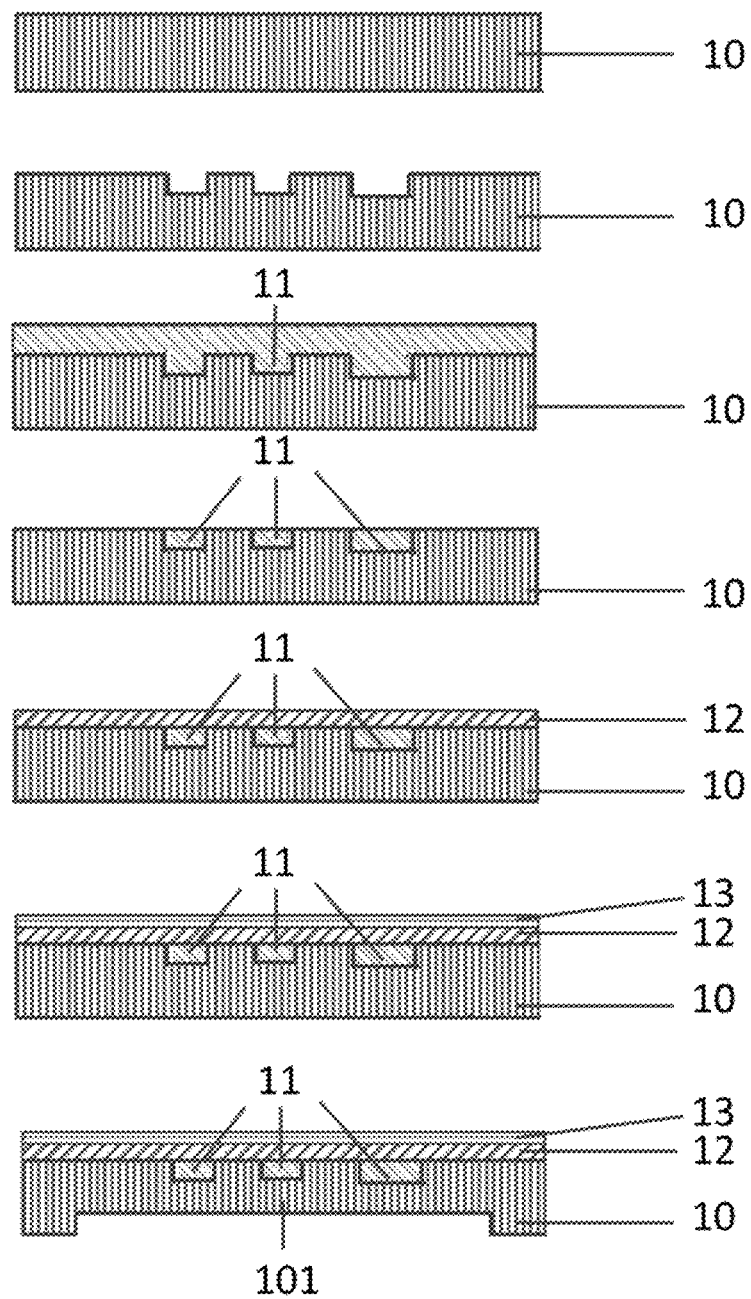
FIG. 1 illustrates one embodiment of the methods of this invention, showing the steps for making an X-ray mask starting from a diamond material substrate.

X-ray lithography utilizes wavelengths throughout the soft and hard x-ray regimes. Soft x-rays are defined here as wavelengths shorter than 13.5 nm and longer than 0.15 nm, and hard x-rays are defined here as wavelengths shorter than 0.15 nm. Using soft x-rays, the mask would utilize thinner absorber layers in the designs but would have shorter working distances. Whereas, hard x-rays would require the use of thicker absorber layers but allow longer working distance. This mask apparatus is exposed using x-rays from x-ray sources such as an accelerator-based source such as a synchrotron, a free electron laser, other accelerator-based sources, or a plasma source.

In one embodiment, an x-ray mask is designed for operation with x-ray wavelengths at 4.4 nm just below the carbon absorption edge at 285 eV and a diamond membrane with thickness ranging from 1 micrometer to 2 micrometers. At this photon energy range, many heavy elements can be used as absorber materials to have sufficiently low transmission with a relatively thin layer, making it possible for fabrication of sub-20 nm features. As one example, a commonly used material in semiconductor industry, 60 nm thick tungsten patterns transmit approximately 10% at this wavelength range. More elements can be readily identified using the absorption cross-section tables in literature.

Diamond material is used as the mask substrate and membrane due to its sufficient transmission of x-rays and high thermal conductivity. The etched pattern into the diamond material membrane that is filled with the absorber material allows for high thermal conductivity from the absorber material into the membrane. Use of diamond material for both the mask membrane and mask substrate also allows for optimal thermal conductivity from the membrane enabling a smaller thermal gradient throughout the membrane. This smaller thermal gradient results in limited thermal expansion which is critical to pattern placement accuracy during lithography. The pattern in the diamond material membrane is etched deep enough to contain highly absorbing features with high resolution and sufficient contrast from the diamond material mask membrane.

By encapsulating the absorber material in the capping layer, the heat transfer from the absorber layer and substrate is improved, and the surface facing the resist is flat and durable, allowing for precision spacing metrology, ease of cleaning, and decreased rate of contamination. The additional layer or layers can serve multiple functions, including protection of the absorber pattern, enhancing the heat transfer, using surface coatings to reduce contamination or particles, and allowing more cycles of cleaning and inspection. The capping layer(s) can be selected from the group consisting of diamond-like carbon, single crystalline diamond, polycrystalline diamond, nano-crystalline diamond, diamond glassy carbon, graphite, graphene, metal, and metal oxides.

The material can then be functionalized through specific bond terminations or attachment of specific molecules to provide surface properties that enhance ease of cleaning, decreased attraction of particulates, durability, and similar features. Specific materials properties of this layer can also be tailored, including electrical conductivity and thermal conductivity, among others.

The mask is attached to its holder with both mechanical strength and high thermal conductivity at its sides. This invention shows one possible mounting and cooling method where the mask is attached via the interface between the mask substrate and a thermally cooled hollow rod composed of highly thermally conducting materials such as copper, aluminum, or diamond. The attachment is performed with a commercially available highly thermally conductive adhesive such as low temperature silver paste, low temperature copper paste, silver paste, copper paste, or other similar materials. The mask holder is cooled with a cooling system such as a cryogenic cooling system or thermoelectric cooler.

The mask is compatible with metrology methods, overlay methods, and alignment methods of the mask to the wafer. Typical alignment apparatus utilizes alignment marks patterned on both the mask and the wafer and illuminates the marks with infrared, visible, or other wavelengths of light. The hollow rod example shown in this invention allows for both incoming and outgoing light pathways for these other wavelengths through the materials. This mounting method is also compatible with other alignment methods, for example using electrical measurement of capacitance between marks on the mask and the wafer.

FIG. 1 shows one example of the process flow for fabricating one embodiment of an x-ray mask in this invention. A diamond material substrate 10 is patterned, for example using electron beam or optical lithography. The pattern is etched into the diamond material substrate 10 and filled with absorber materials 11 through deposition techniques such as sputtering, atomic layer deposition, physical vapor deposition, electroplating, or other similar techniques. Depending on the deposition technique, the absorber material may fill the etched pattern entirely or may conformally coat the sidewalls. Conformally coating the sidewalls, for example using atomic layer deposition, could lead to a double patterning effect that produces absorber structure that covers the sidewalls but not necessarily fills the etched space in the substrate entirely. This could produce absorber patterns with higher aspect ratio (height vs lateral length) that can be beneficial for high resolution lithography. Absorber materials 11 include highly attenuating materials for the specific wavelength of light utilized in the lithography system such as tungsten, copper, gold, platinum, iridium, lead, tantalum hafnium, tin, silver, palladium, ruthenium, molybdenum, niobium, germanium, zinc, nickel, cobalt, iron, chromium, titanium, vanadium, scandium, silicon, and aluminum. The absorber material 11 can also be composed of oxides or nitrides of some of the previous materials such as aluminum oxide, hafnium oxide, titanium nitride, and other similar types of materials. The absorber material 11 could also be composed of alloys of these materials. The absorber material 11 could also be composed of multilayers of these materials. The thickness of the pattern is dependent on the optimal absorption obtainable for use with a specific wavelength of photon energy and the pattern size.

The structure, absorber material 11 on diamond material substrate 10, is then polished and planarized to remove additional absorber material that is not located within the etched pattern, and is then covered by a capping layer 12, using diamond, diamond-like carbon, graphite, metal, metal oxide, or other similar materials. This capping layer 12 is very thin and is less than several hundred nanometers in thickness. The material can then be functionalized through specific bond terminations or attachment of specific molecules to provide surface properties that enhance ease of cleaning, decreased attraction of particulates, durability, and similar features. Specific materials properties of this layer can also be tailored, including electrical conductivity, thermal conductivity, and others. An additional capping layer 13 can be coated to tailor the surface. The structure is then etched from the back of the diamond material substrate 10 to form the diamond material membrane 101 with required thickness in the patterned area to allow sufficient x-ray transmission. Optional stress control, using ion implantation, can be applied in combination with the etching process to achieve low stress to prevent membrane bowing and cause pattern errors. This ion implantation step into the diamond 10 can also be performed prior to initial patterning of the mask pattern.

Figure 2:
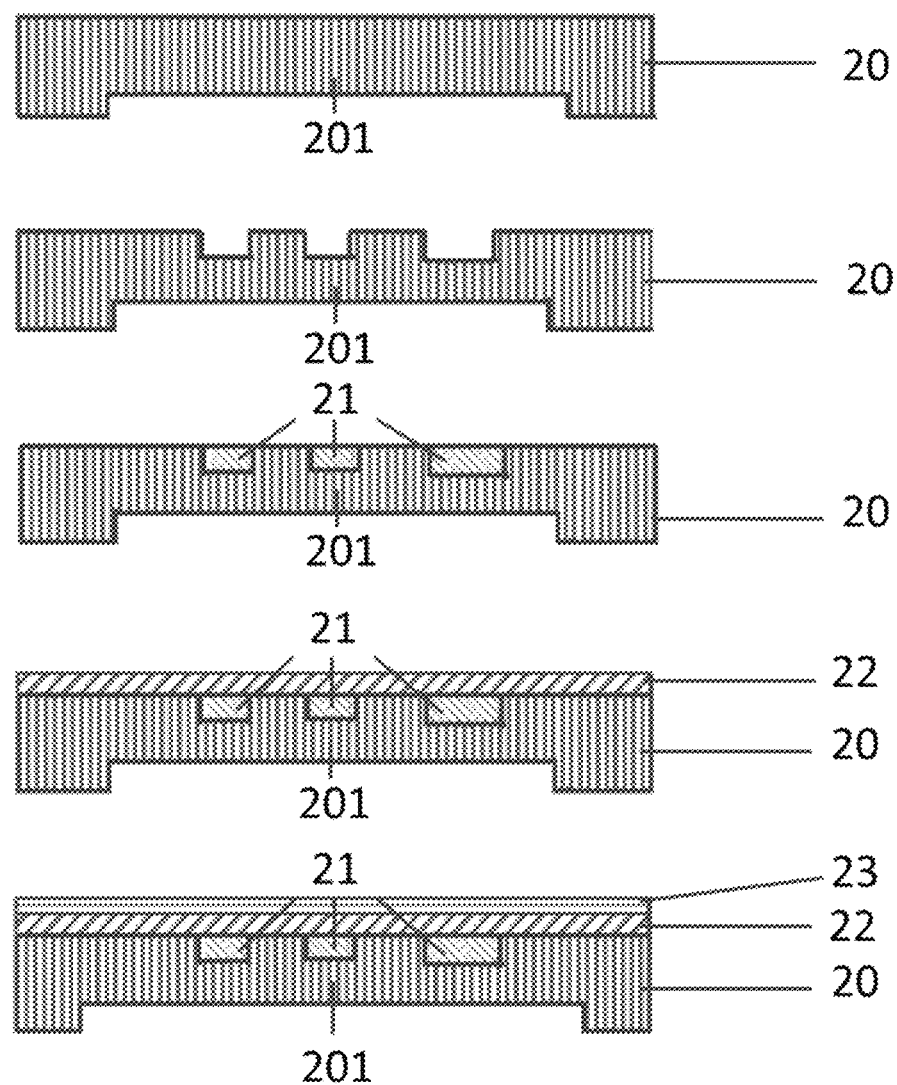
FIG. 2 illustrates a similar embodiment where the mask fabrication starts from a thinned diamond material membrane.

FIG. 2 shows another embodiment example, in which the diamond material substrate 20 is thinned to form the diamond material membrane 201 first and then processed with similar patterning and capping steps. The absorbing materials layer 21, capping layer 22, and the optional additional capping layer 23 are shown in the figure.

Figure 3:
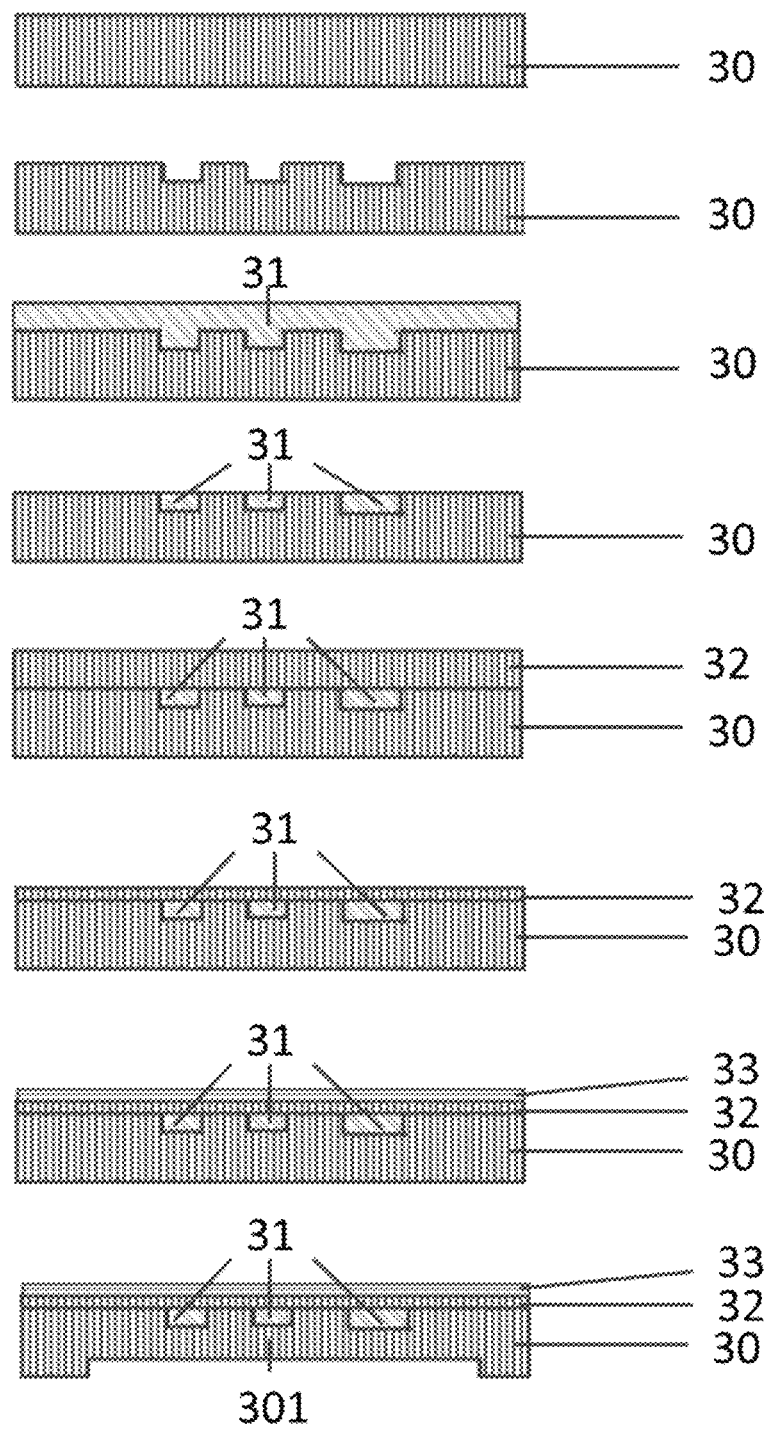
FIG. 3 shows further embodiment examples where the capping layer is also a diamond material layer, which is grown or bonded to the diamond material substrate.

The capping layer can also be another layer of diamond material. FIG. 3 shows an embodiment example in which a diamond material capping layer 32 is grown or bonded to the diamond material substrate 30 after absorber 31 filling and planarization. The diamond material capping layer 32 will then be thinned down to within the proximity printing requirements. The additional capping layer 33 can be further added, as well as the thinning of diamond material substrate 30.

Figure 4:
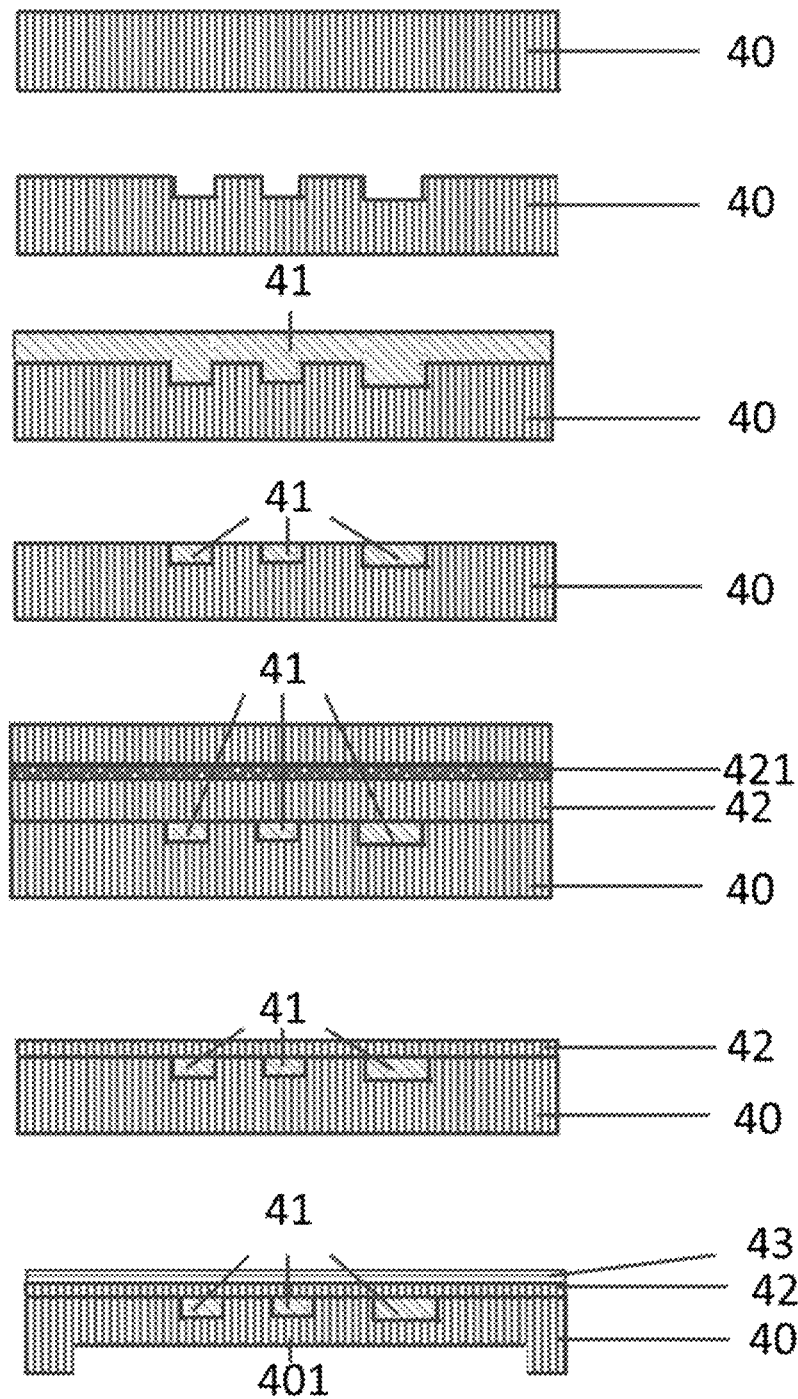
FIG. 4 shows further embodiment examples where the capping layer contains an ion-implanted diamond material layer utilized for further release and thinning.

In a further embodiment as shown in FIG. 4, the capping diamond layer 42 is grown or bonded to the diamond material substrate 40 after the same process of filling absorbing materials 41 as described previously. In this embodiment, the capping layer 42 contains a depth-controlled ion implanted mid-layer 421 that can be utilized as a release layer for further thinning of the capping diamond material layer 42.

Figure 5:
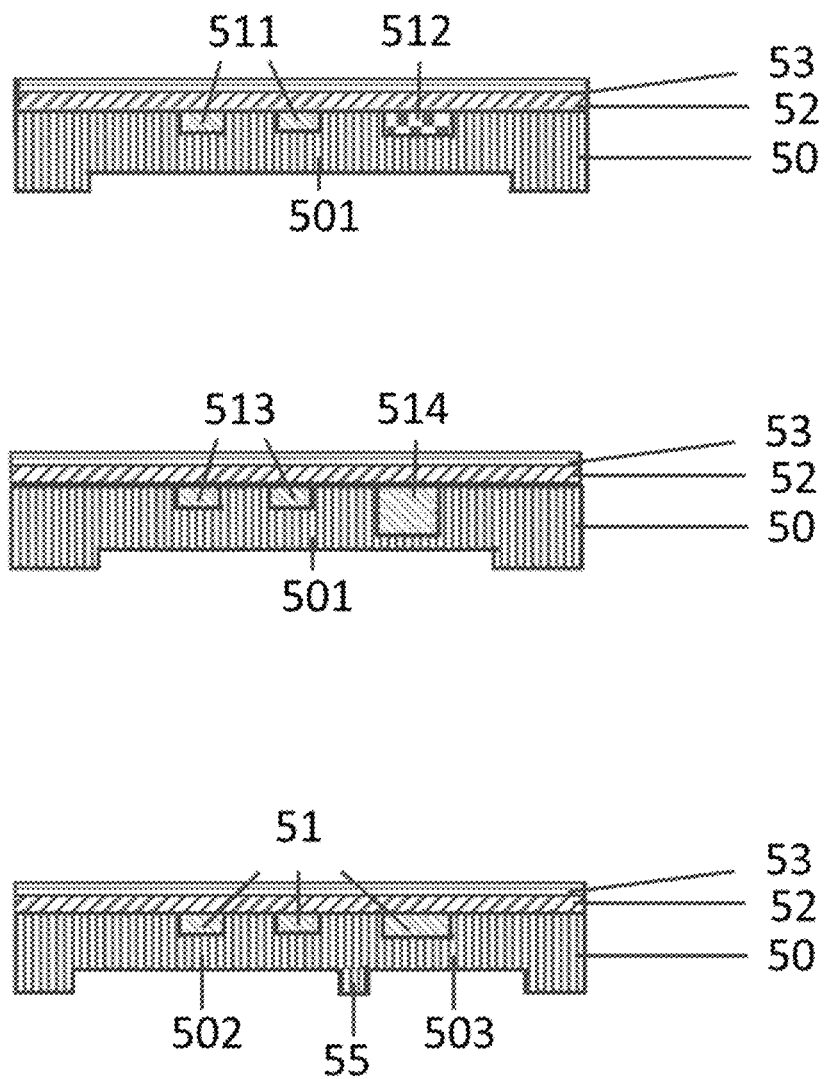
FIG. 5 shows alternative absorber filling schemes where a plurality of materials and a plurality of thicknesses are used and shows an alternative mask design where a plurality of membrane windows along with its corresponding support structures are included within a single mask.

The pattern etching and absorber filling steps can be expanded to allow different etch depths and/or different materials, through multiple patterning techniques. FIG. 5. shows two embodiment examples. On the top, two different absorber materials, 511 and 512, are filled into diamond substrate 50. On the bottom, the same absorber material are filled to different depths, shown as 513 and 514. Additional embodiments can be expected as combinations are possible. For example, a gray scale x-ray mask can be made, improving the image formation in resist and opening the door for OPC (optical proximity correction) at x-ray wavelengths. The last image on FIG. 5. depicts the option of fabricating a plurality of diamond material membranes on a single mask. To minimize stresses in the membrane and membrane fragility, the plurality of membranes, 502 and 503, can be patterned on a single mask. Stabilizing struts 55 are located in between these membranes to enhance the mechanical stability and robustness. In those figures when applicable, absorbing materials 51, capping layer 52, additional capping layer 53, and thinned diamond material membrane region 501 are shown.

Figure 6:
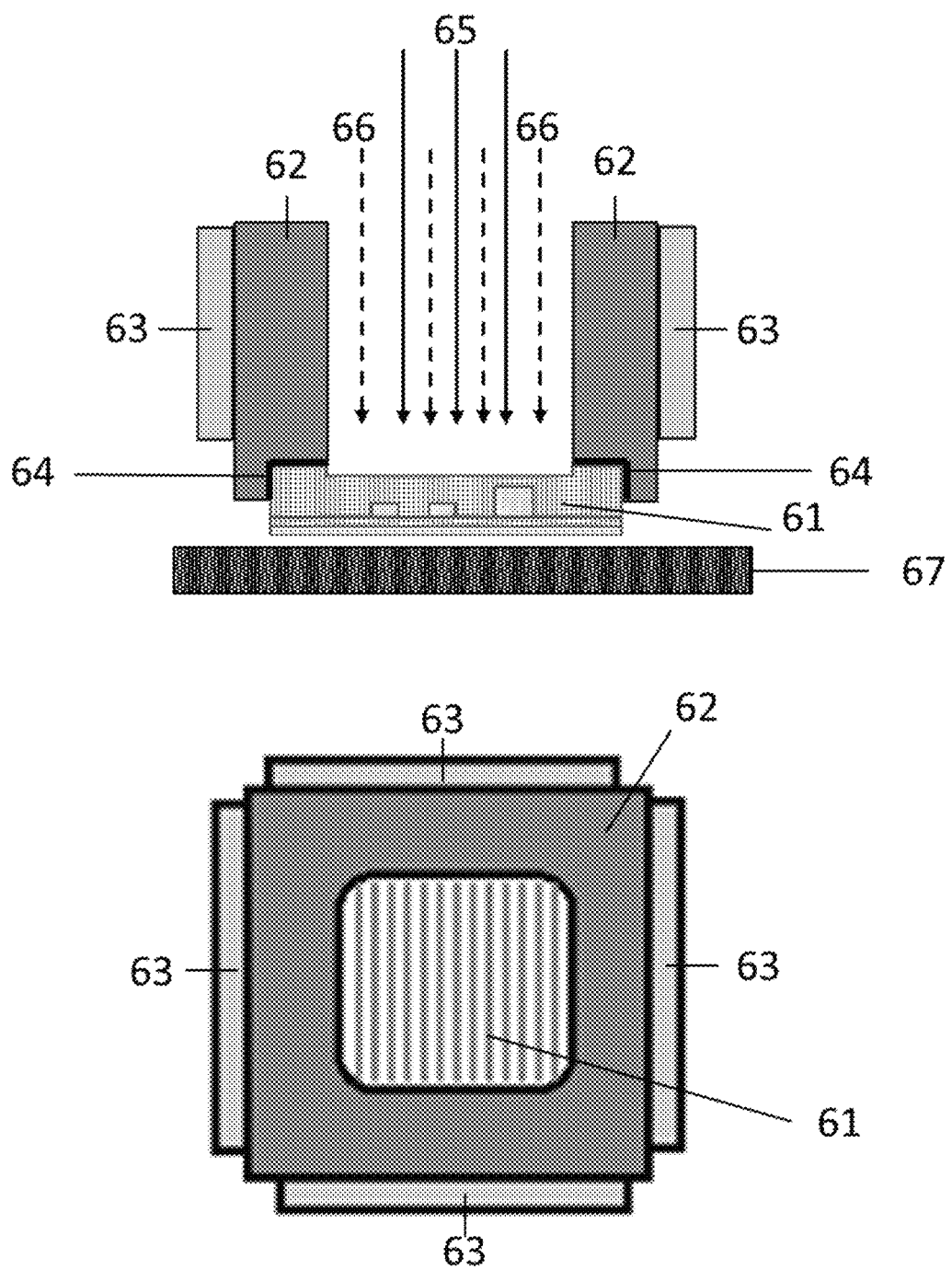
FIG. 6 shows embodiments examples of attaching the mask structure to a holder that allows for cooling and overlay and alignment laterally and axially.

FIG. 6 shows the side and top-down views of one possible mounting and cooling method where the mask 61 can be attached via the interface between the mask substrate and a thermally cooled mask mount 62 composed of highly thermally conducting materials such as copper, aluminum, diamond, or other highly thermally conducting material. The mask needs to be mounted facing the wafer 67 with minimal to no gap. Therefore, the mask needs to be securely attached to its holder with both enough mechanical strength and good thermal conductivity from its lateral sides and back side. By using a single crystal or polycrystalline diamond substrate as both the mask membrane and mask substrate, the attachment of the mask to a thermally conductive material with minimal stress is possible. The attachment can be performed with a commercially available highly thermally conductive adhesive 64 such as low temperature silver paste, low temperature copper paste, silver paste, copper paste, or other similar materials. The mask holder 62 can be cooled via a cryogenic cooler 63, thermoelectric cooler, or other very low vibration cooling mechanism. The cooler interface 63 can be placed on the sides or top surfaces of the mount 62. The mask mount 62 is hollow in the middle which allows for not only X-ray photons 65 to pass through but also infrared, visible, and ultraviolet photons 66 for compatibility with metrology schemes and alignment laterally, axially, tip, and tilt.

The claims defining the invention are as follows:

1. A mask for X-ray lithography and metrology, comprising:
   a substrate composed of diamond material;
   a patterned membrane composed of diamond material;
   an x-ray absorber layer embedded into the patterned membrane; and
   at least one capping layer covering a surface of the x-ray absorber layer and the patterned membrane.

2. The mask of claim 1, wherein a thickness of the patterned membrane is greater than 0.05 micrometers and less than 5 micrometers.

3. The mask of claim 1, wherein patterns in the patterned membrane have a single binary depth.

4. The mask of claim 1, wherein patterns in the patterned membrane have multiple binary depths.

5. The mask of claim 1, wherein patterns in the patterned membrane have grayscaled depths.

6. The mask of claim 1, wherein the x-ray absorber layer is selected from the group consisting of tungsten, copper, gold, platinum, iridium, lead, tantalum, hafnium, hafnium oxide, tin, silver, palladium, ruthenium, molybdenum, niobium, germanium, zinc, nickel, cobalt, iron, chromium, titanium, titanium nitride, vanadium, scandium, silicon, silicon carbide, silicon dioxide, silicon nitride, aluminum, aluminum oxide, and aluminum nitride.

7. The mask of claim 1, wherein the x-ray absorber layer comprises a combination of materials selected from the group consisting of tungsten, copper, gold, platinum, iridium, lead, tantalum, hafnium, hafnium oxide, tin, silver, palladium, ruthenium, molybdenum, niobium, germanium, zinc, nickel, cobalt, iron, chromium, titanium, titanium nitride, vanadium, scandium, silicon, silicon carbide, silicon dioxide, silicon nitride, aluminum, aluminum oxide, and aluminum nitride.

8. The mask of claim 1, wherein the x-ray absorber layer fills the patterned membrane uniformly.

9. The mask of claim 1, wherein the x-ray absorber layer conformally coats sides of the patterned membrane.

10. The mask of claim 1, wherein the at least one capping layer is selected from the group consisting of diamond-like carbon, single crystalline diamond, polycrystalline diamond, nano-crystalline diamond, diamond glassy carbon, graphite, graphene, metal, and metal oxides.

11. The mask of claim 1, wherein the at least one capping layer comprises a combination of materials selected from the group consisting of diamond-like carbon, single crystalline diamond, polycrystalline diamond, nano-crystalline diamond, diamond glassy carbon, graphite, graphene, metal, and metal oxides.

12. The mask of claim 1, further comprising a mounting structure that is adhered to the mask with a thermally conductive material and with active cooling apparatus to control a temperature of the mask.

13. The mask and mounting structure of claim 12, wherein the mounting structure is hollow to allow metrology beams to probe the mask from either direction, the metrology beams comprising one or more of infrared, visible, ultraviolet or x-ray wavelengths.

* * * * *